United States Patent [19]

Wilson et al.

[11] Patent Number: 5,262,787
[45] Date of Patent: Nov. 16, 1993

[54] RECIRCULATING DELAY LINE RADAR PERFORMANCE MONITOR

[75] Inventors: William J. Wilson, Wenham, Mass.; David G. Armstrong, Brunswick, Me.; Roy E. Byington, Sudbury; Nathan Freedman, West Newton; Neil F. Lacey, Framingham; Fritz A. Gross, Weston, all of Mass.

[73] Assignee: Raytheon Company, Lexington, Mass.

[21] Appl. No.: 19,323

[22] Filed: Feb. 10, 1993

Related U.S. Application Data

[63] Continuation of Ser. No. 205,526, Jun. 9, 1988, abandoned, which is a continuation of Ser. No. 23,068, Mar. 6, 1987, abandoned.

[51] Int. Cl.⁵ .............................................. G01S 7/10
[52] U.S. Cl. .................................. 342/173; 342/172; 342/174
[58] Field of Search ................ 342/169, 172, 173, 174

[56] References Cited

U.S. PATENT DOCUMENTS

| | | |
|---|---|---|
| 2,872,673 | 2/1959 | Pleasure ............................. 342/172 |
| 2,876,447 | 10/1953 | Witten, Jr. et al. . |
| 3,172,105 | 3/1965 | Schwab .............................. 342/172 |
| 3,449,746 | 6/1969 | Begeman et al. ................... 342/172 |
| 4,053,890 | 10/1977 | Woodson, III et al. . |
| 4,121,213 | 10/1978 | Bush et al. ......................... 342/172 |
| 4,145,692 | 3/1979 | Armstrong et al. . |
| 4,319,247 | 3/1982 | Warren ......................... 342/172 X |
| 4,329,688 | 5/1982 | Goldie . |
| 4,499,469 | 2/1985 | Kesterson . |
| 4,598,294 | 7/1986 | Guhse . |
| 4,683,473 | 7/1987 | Haugland ........................... 342/172 |

*Primary Examiner*—Tod R. Swann
*Attorney, Agent, or Firm*—Walter F. Dawson; Richard M. Sharkansky

[57] ABSTRACT

A radar performance monitor (RPM) receives a transmitted radar signal from a radar system being monitored and couples the signal to a recirculating loop comprising a SAW delay line in order to produce a series of simulated radar return signals of equal amplitude and by using the same frequency as the received radar signal providing the frequency falls within a predetermined bandwidth of the SAW delay line. The simulated radar return signals are displayed at the radar system and used to evaluate the operation and calibration of a transmitter and the sensitivity and calibration of a transmitter and the sensitivity and calibration of a receiver in the radar system. The radar performance monitor is actuated at the option of a radar operator.

14 Claims, 7 Drawing Sheets

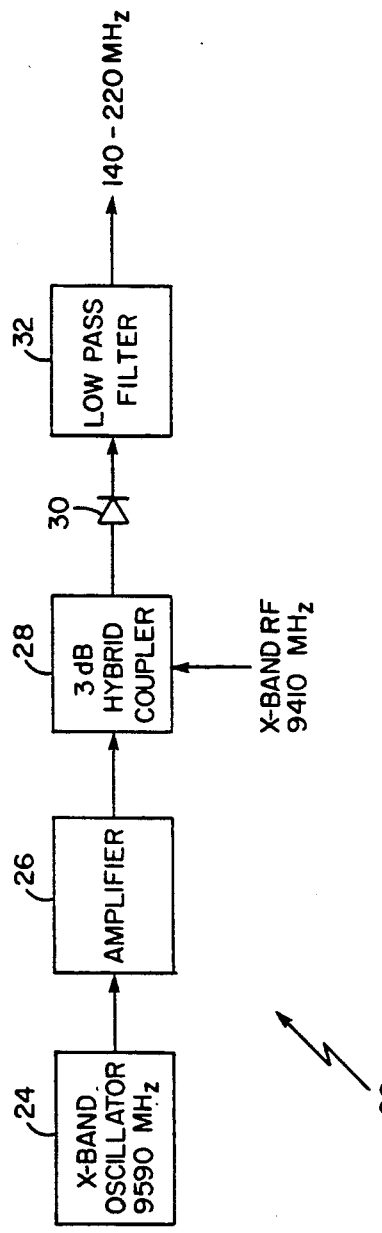
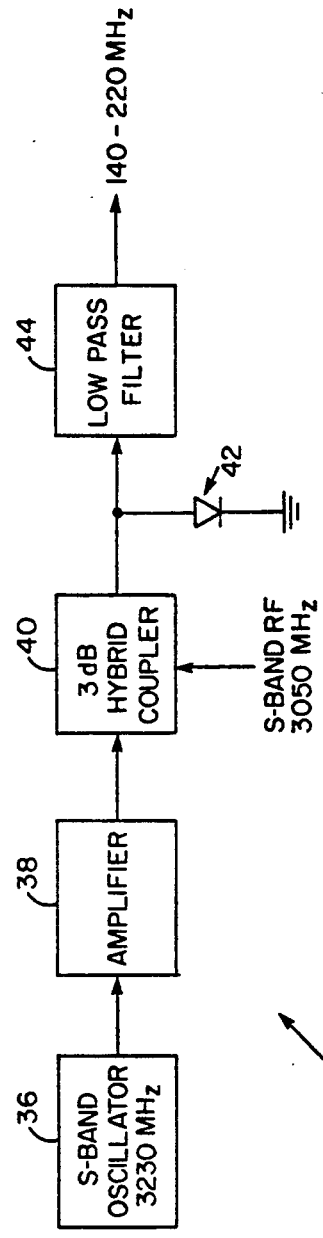
FIG. 3A
FIG. 3B

RECIRCULATING DELAY LINE RADAR PERFORMANCE MONITOR

This application is a continuation of application Ser. No. 07/205,526 filed Jun 9, 1988, which is a continuation of application Ser. No. 07/023,068, filed Mar 6, 1987, both abandoned

BACKGROUND OF THE INVENTION

This invention relates to radar systems and in particular to an apparatus for testing the performance of a radar system by monitoring the radar transmitted power, the receiver sensitivity and tuning.

Such a radar performance monitor is described in U.S. Pat. No. 4,145,692 to David G. Armstrong et al and assigned to the present assignee. As stated therein it is generally not difficult to determine whether a land-based radar is operating properly or not; there are small fixed targets whose appearance on the display is known and remembered, and if they fade or disappear, the radar is losing sensitivity or malfunctioning. Marine radars, on the other hand, are generally used far out at sea where there may normally be no targets and a partial or complete loss of radar performance may not be apparent to the operator. Some countries require by law that the marine radars be equipped with some sort of performance monitor and this requirement will become more prevalent. Such monitors are particularly useful with the kind of radar which performs automatic tracking and can operate in a night watch mode in which it is unattended by an operator. If the radar detects and tracks an object which may be on a collision course, an alarm is sounded. The alarm is also sounded if the performance monitor detects a radar malfunction alerting the operator that automatic tracking is not being reliably provided.

An echo box has been used in the past for monitoring radar performance; this has been generally expensive and not very satisfactory. It usually requires direct coupling into the radar's RF transmission line. It is limited in the range at which it can produce a response on the radar's display. It commonly requires a mechanical, motor-driven, tuning device.

The invention described in U.S. Pat. No. 4,145,962 not only provided a test pattern for monitoring the radar's transmitted power level and receiver sensitivity but also indicated the proper tuning of the receiver to the transmitter frequency, and therefore, was used as an aid in tuning a manually tunable radar receiver. However, that performance monitor had a local oscillator controlled by an AFC loop which was complicated and required many parts resulting in relatively high costs and low reliability as compared with the performance monitor of the present invention.

SUMMARY OF THE INVENTION

In accordance with the present invention an apparatus and method is provided by a radar performance monitor (RPM) having a recirculating delay line and mounted near an antenna of a radar system for determining the performance of the radar system. In addition, a method is provided for calibrating the monitoring of the power output of a transmitter of the radar system and a method is provided for calibrating the monitoring of the sensitivity of a receiver of the radar system. The radar performance monitor is a low power transponder that is controlled remotely by a radar operator to test for degradation of the radar system transmitter power and receiver sensitivity. The RPM transmits a series of simulated radar target return signals of known amplitude if the incoming signal from the radar system is of the correct power level and frequency. The RF output of the RPM may be used to tune the radar system in the absence of natural targets.

In accordance with the present invention a radar performance monitor is provided comprising means for receiving a radar signal from the radar system, means coupled to said receiving means for converting the radar signal to an intermediate frequency (IF) signal, means coupled to the converting means for gating the IF signal to a recirculating loop when the signal exceeds a predetermined amplitude, the recirculating loop comprising delay line means for generating a plurality of simulated radar target return signals, and means coupled to the recirculating loop for transmitting the plurality of simulated radar target return signals to the radar system antenna for displaying the simulated radar target return signals on a display means of the radar system. The delay line means in the recirculating loop comprises a surface acoustical waveguide (SAW) delay line. A power divider coupled to a power splitter provides for coupling the plurality of simulated radar target return signals from the recirculating loop to the transmitting means. The plurality of simulated radar target return signals provide a distinct test pattern on the display means of the radar system simultaneously with normal radar target returns and the test pattern comprises a series of arcs having a predetermined width and separation in range and extending from a first to a second predetermined range limit on the display means with the azimuth width of the pattern being determined by a radiation pattern of the radar antenna.

In accordance with the present invention a method is provided for determining the performance of a radar system by mounting a radar performance monitor near an antenna of the radar system comprising the steps of receiving a radar signal transmitted by the antenna, converting the radar signal to an intermediate frequency (IF) signal, gating the IF signal to a recirculating loop when the IF signal exceeds a predetermined amplitude, generating a plurality of simulated radar target return signals in the recirculating loop comprising a surface acoustical waveguide delay line means, transmitting the plurality of simulated radar target return signals to the radar system antenna, and displaying the simulated radar target return signals on a display means of the radar system. The method further comprises the step of providing on the display means a distinctive pattern of the plurality of simulated radar return signals in the form of a series of arcs separated in range and extending from a first to a second predetermined range limit on the display means with the azimuth width of the pattern being determined by a radiation pattern of the radar antenna.

In accordance with a further feature of the present invention, a method of calibrating the monitoring of the power output of a transmitter of a radar system is provided using a radar performance monitor mounted near an antenna of the radar system comprising the steps of receiving a radar signal in the radar performance monitor transmitted by the radar system, generating a plurality of simulated radar target return signals in the radar performance monitor in response to the received radar signal, switching a fixed attenuating means in series with the received radar signal, adjusting a detector means for the received radar signal such that the simulated radar target return signals are barely generated or visible on a display of the radar system, and removing the attenuating means and observing the simulated radar target return signals on the display of the radar system, the transmitter having acceptable output power when the return signals are visible on the display means.

In accordance with a further feature of the present invention, a method of calibrating the monitoring of the sensitivity of a receiver of a radar system is provided using a radar performance monitor mounted near an antenna of said radar system comprising the steps of generating a plurality of simulated radar target return signals in the radar performance monitor, monitoring the return signals on a display means of the radar system, switching a fixed attenuating means in series with the generated plurality of simulated radar return signals, transmitting the plurality of simulated radar target return signals to the antenna of the radar system, adjusting the return signals monitored on the display means of the radar system to be barely visible when the attenuating means is switched in series, and removing the attenuating means and observing the return signals on the display, the receiver having acceptable sensivitity to signals at the frequency of a transmitter of the radar system when the return signals are visible on the display means.

BRIEF DESCRIPTION OF THE DRAWINGS

Other and further features of the invention will become apparent in connection with the accompanying drawings wherein:

FIG. 3A is a block diagram of an X-BAND frequency converter within the radar performance monitor;

FIG. 3B is a block diagram of an S-BAND frequency converter within the radar performance monitor;

DESCRIPTION OF THE PREFERRED EMBODIMENT

Figure 1:
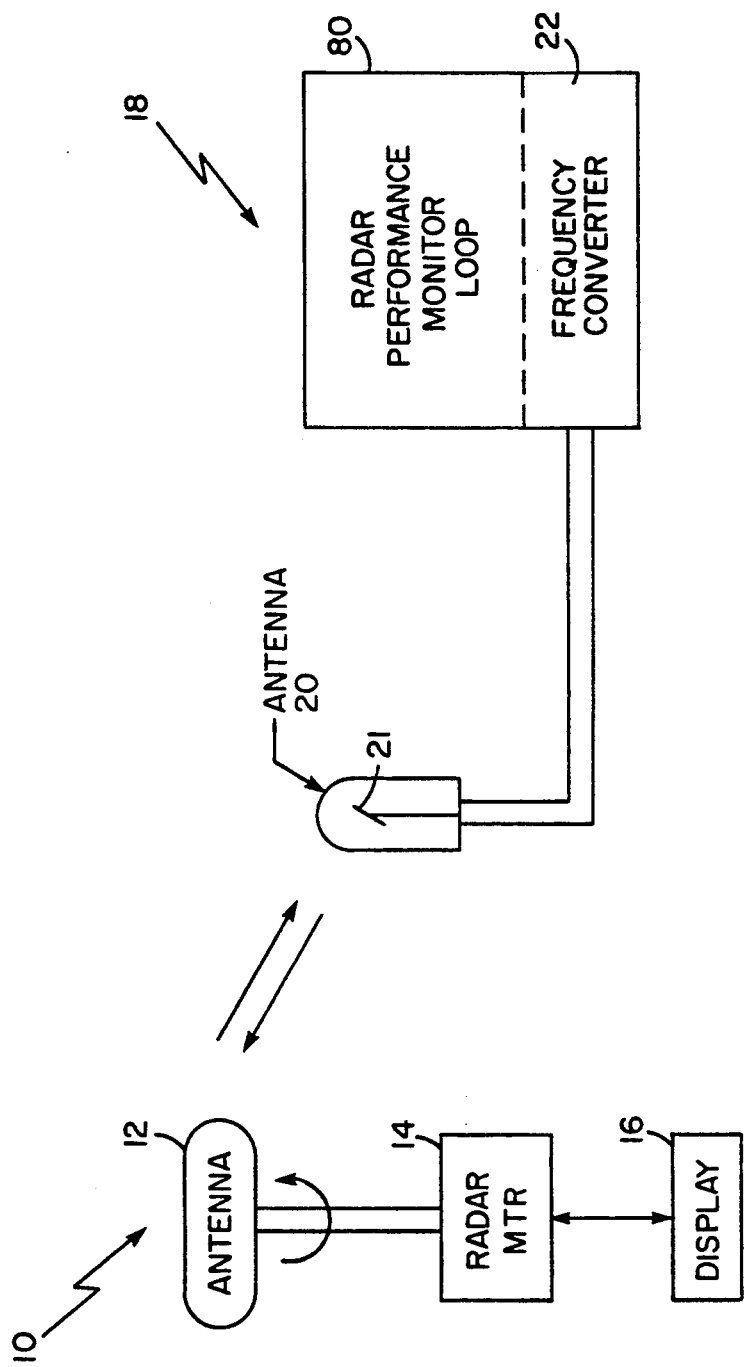
FIG. 1 is a block diagram of a radar system and the radar performance monitor of the invention for use with the radar system.

Referring now to FIG. 1 there is shown a block diagram of a radar system 10 used in connection with a radar performance monitor (RPM) 18 of the present invention. The radar system comprises an antenna 12, a modulator-transmitter-receiver (MTR) 14 and a display 16. The antenna 12 is in practice mounted as high as possible with an unobstructed path for the antenna beam to maximize the range of the antenna 12. The radar MTR 14 is located in a weather-tight position as close as is practical to the antenna 12 to minimize losses in the high-power transmit pulses coupled to antenna 12 and the low-level receive signals coupled from antenna 12. The display 16 coupled to MTR 14 provides for the display of radar information and includes operating controls of the radar system 10 and control of the radar performance monitor 18.

Figure 2:
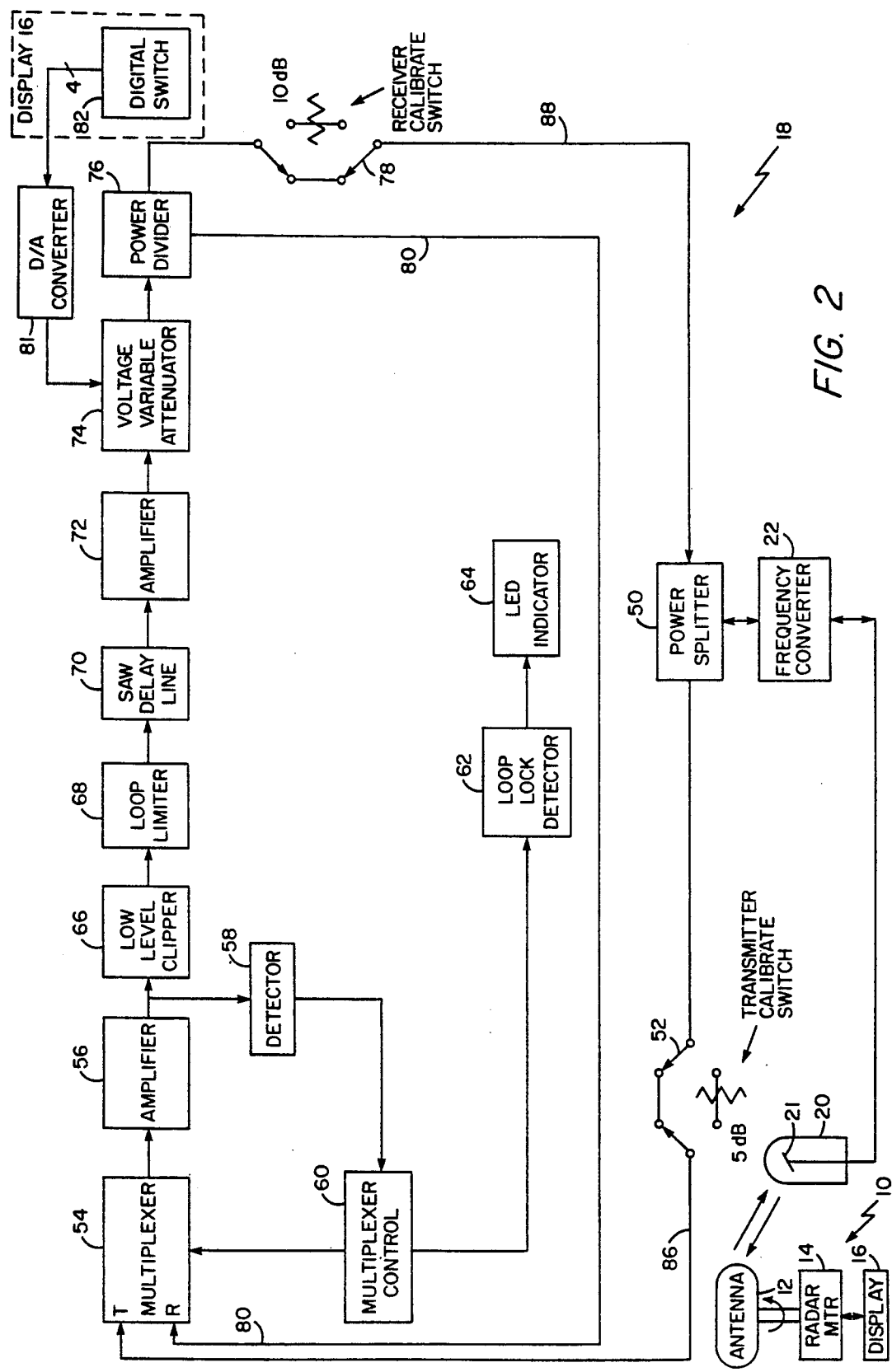
FIG. 2 is a detailed block diagram of the radar performance monitor of the invention.

A basic block diagram of the radar performance monitor (RPM) 18 is also shown in FIG. 1 adjacent to the radar system 10. The RPM 18 comprises an antenna 20 coupled to a frequency converter 22 which is coupled to an RPM loop 24. The RPM 18 is a low power transponder that is controlled by a radar operator located at the display 16 of radar system 10. The RPM 18 tests for degradation of the radar transmitter power and of the radar receiver sensitivity to signals of the radar transmitter frequency. The RPM 18 transmits a train of simulated targets of known amplitude if the incoming signal from the radar system 10 is of the correct power level and frequency. The radio frequency (RF) output of the RPM 18 from antenna 20 is used to tune the radar receiver of the MTR 14 particularly in the absence of natural targets such as in shipboard applications far at sea. Distinct arcs within a wedge shaped area appear on the radar system display 16 when the radar receiver of the MTR 14 is sufficiently sensitive and properly tuned. The RPM 18 is generally attached directly to the support structure of the rotary radar antenna and operates asynchronously with respect to the radar system 12 as shown in FIG. 1 and FIG. 2. Power to the RPM 18 is controlled by the radar operator. 12 just below the antenna. The frequency converter 22 may comprise a local oscillator operating in X-Band at 9590 MHz or a local oscillator operating in S-Band at 3230 MHz.

Referring now to FIG. 2, there is shown a detailed block diagram of the RPM 18. Radar antenna 12 transmits a series of pulses into space. Antenna 20 receives a sample of the transmitted pulses which may be at X-Band or at S-Band. For the present embodiment, the transmitted pulses are in the X-Band at 9410 MHz. Antenna 20 comprising a microwave patch 21 couples the received pulses to an input of the X-Band frequency converter 22.

Figure 6:
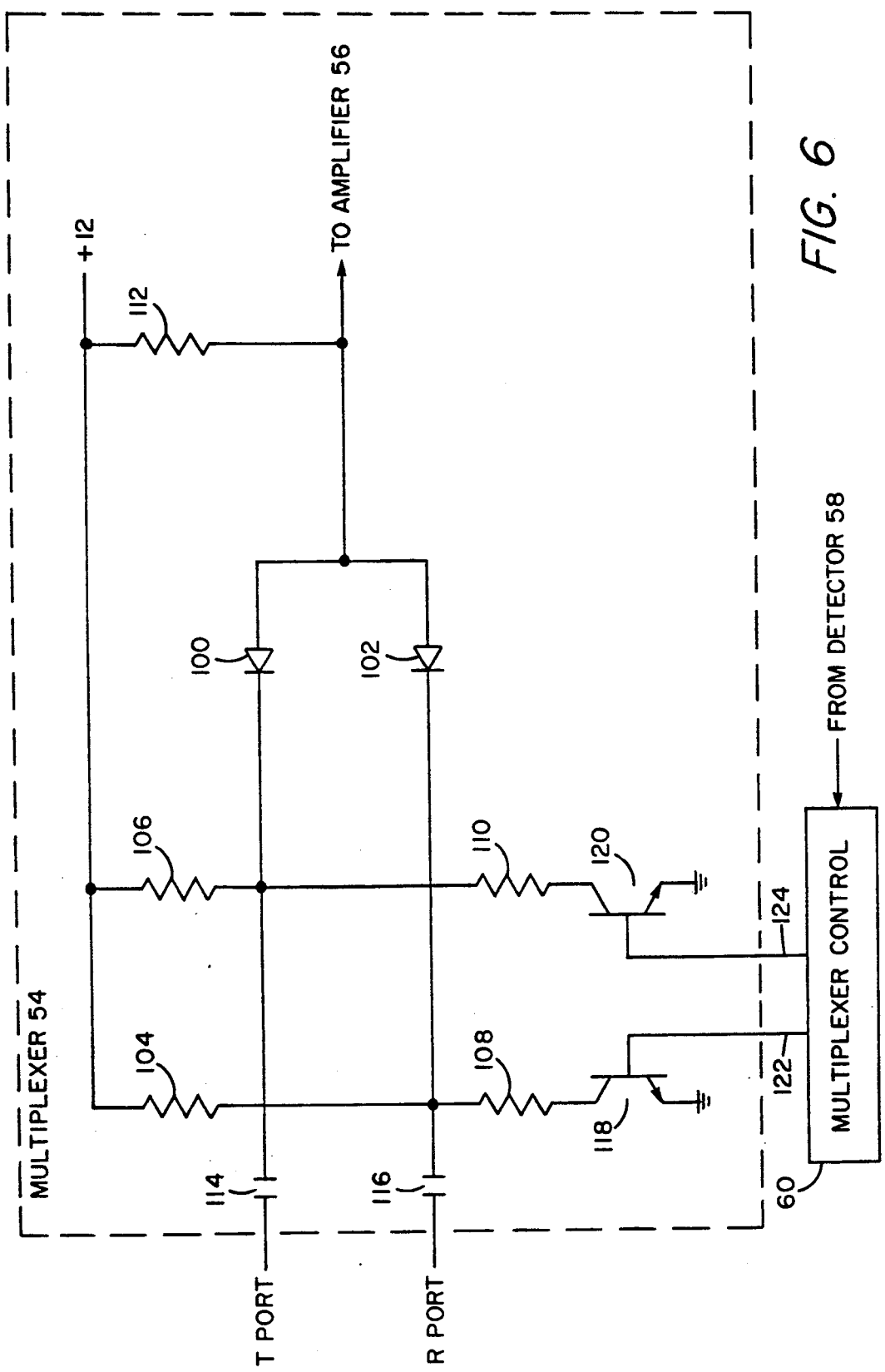
FIG. 6 is a schematic diagram of the multiplexer shown in FIG. 2.

The X-Band frequency converter 22 down-converts the incoming 9410 MHz signal to a 180 MHz intermediate frequency (IF) signal which is coupled to a power splitter 50. The power splitter 50 is a two way in-phase power splitter combiner which may be embodied by Model PSE-2-1 manufactured by Minicircuits of Brooklyn, NY. The IF signal passes through the power splitter 50 (which also passes an output signal from a power divider 76 back to the microwave patch antenna 20) and couples the IF signal to a recirculating loop 80 via a T-port of multiplexer 54. A small portion of the IF signal from the second output of power splitter 50 is coupled to power divider 76 but is essentially attenuated and does not affect the RPM 18 operation. Referring now to FIG. 6, the multiplexer 54 comprises two DC controlled pin diodes (100, 102) which act as variable resistors. Initially pin diode 100 is on (transistor 118 saturated) and pin diode 102 is off (transistor 120 cutoff). Pin diode 100 feeds the transmitter sample into the loop. Resistors 104, 106, 108 and 110 provide isolation of the RF path from the DC path as well as bias current control. When the transmitter sample has been introduced into the loop, the multiplexer control 60 switches diode 100 off (transistor 118 cutoff) and diode 102 on (transistor 120 saturated) to permit continuous circulation. The pin diodes 100 and 102 typically offer 35 dB of isolation when biased off.

Figure 7:
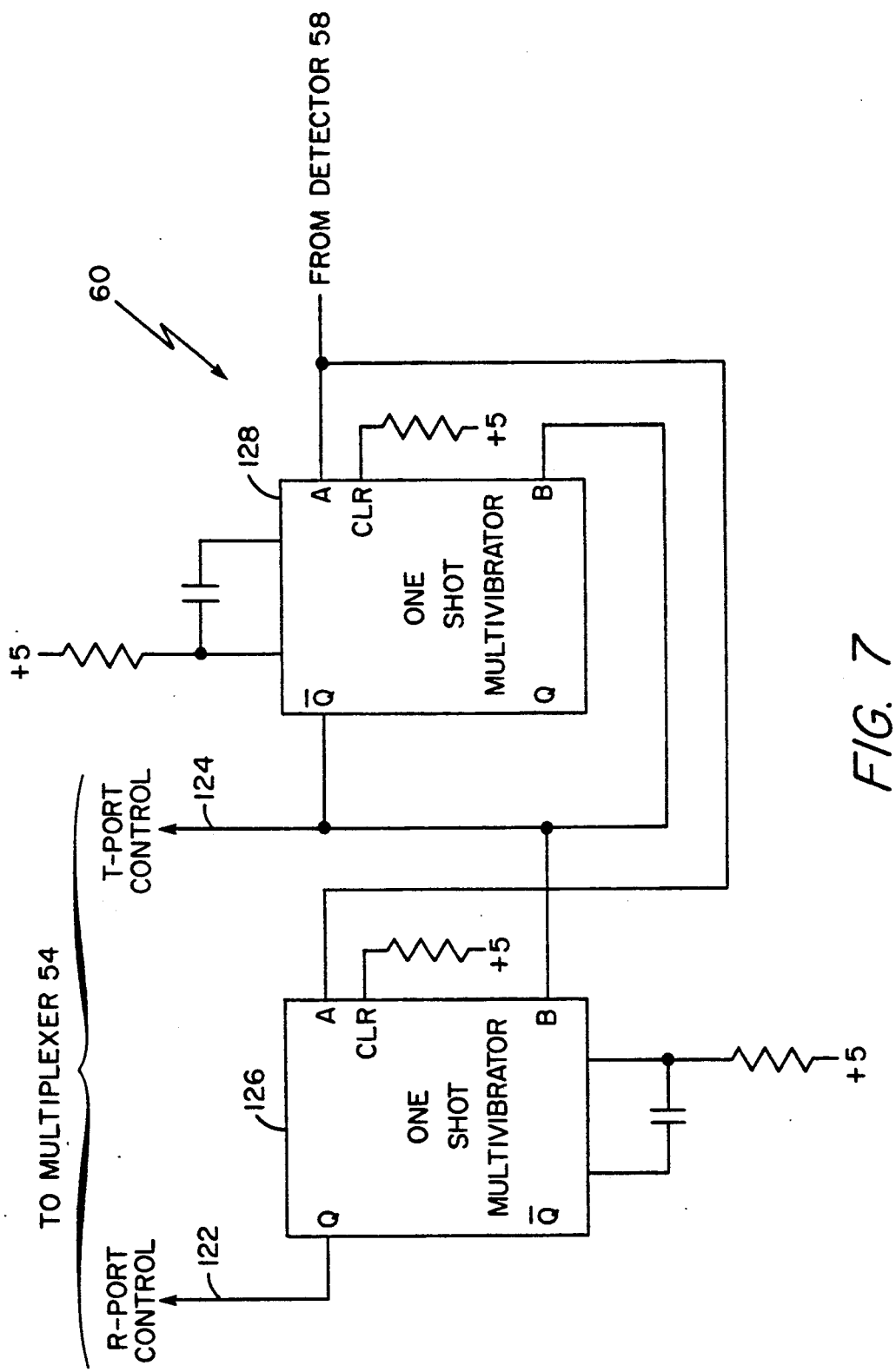
FIG. 7 is a block diagram of the multiplexer control shown in FIG. 2.

Referring now to FIG. 2 and FIG. 7, the IF signal entering the recirculating loop 80 is amplified and detected by amplifier 56 and detector 58. The detector 58 converts the RF signal into a DC voltage and comprises an adjustable resistor for setting the point at which the loop 80 turns on which typically occurs at −10 dBm. The detector 58 output is coupled to multiplexer control 60 which comprises dual one-shot multivibrators as shown in FIG. 7. The detector output triggers one-shot multivibrators 126 and 128 in multiplexer control 60 which enables or gates on the R-port of the multiplexer 54 for 75 microseconds and disables or inhibits the T-port for approximately 340 microseconds. The one-shot multivibrator 128 controlling the T-port has a longer time constant or period than the one-shot multivibrator 126 to insure that the recirculating loop 80 has been off for some time before the T-port is enabled again. This timing insures that the simulated radar target return signals or pulses delayed by SAW delay line 70 are not prematurely entered into the T-port of multiplexer 54 setting the RMP 18 into oscillation. The one-shot multivibrators 126, 128 may be embodied by Model 74221 dual monostable multivibrators as manufactured by Texas Instruments of Dallas, Texas. The recirculating loop 80 is constructed so that the loop gain is greater than unity and incorporates limiting to maintain constant pulse amplitude.

Still referring to FIG. 2, the IF signal after passing through amplifier 56 is coupled to a low level clipper 66 which separates the signal from the noise and eliminates noise build-up by passing only signals above a certain amplitude. When the IF signal is below +13 dBm, there will be considerable attenuation. If the RF input signal excedes +13 dBm, there is little attentuation. The low level clipper 66 comprises two back-to-back Schottky diodes in series with the incoming signal with a matching resistor on either side of the clipper, such design being readily known to one skilled in the art. The RF signal is then coupled to a loop limiter 68 which sets the maximum limiter output level to 3 dBm. This limits the signal dynamic range to 10–12 dB which is the ratio of the limit level to clipping level.

The signal from the loop limiter 68 is then coupled to a wideband surface acoustical waveguide (SAW) delay line 70 which in conjunction with the loop 80 generates a series of similated radar target returns under the control of the multiplexer control 60. The number of target returns generated is determined by the length of time that the multiplexer control 60 enables the R-port of multiplexer 54. The SAW delay line 70 may be embodied by model number CTI-160 as manufactured by Crystal Technology of Palo Alto, CA having a 4 microsecond delay, a center frequency of 180 MHz, a bandwidth of 80 MHz and an insertion loss of 28 db. The signals delayed by the SAW delay line 70 are coupled to an amplifier 72 which makes up for the loss of the SAW delay line 70: and furnishes an input signal to a power divider 76. The multiplexer control 60 determines how many pulses pass through the SAW delay line 70. As descried hereinbefore the one-shot multivibrator 126 in multiplier control 60 enables the R-port for 75 microseconds which provides for approximately 18 pulses (75÷4 microseconds SAW delay) to pass through the loop.

Figure 8:
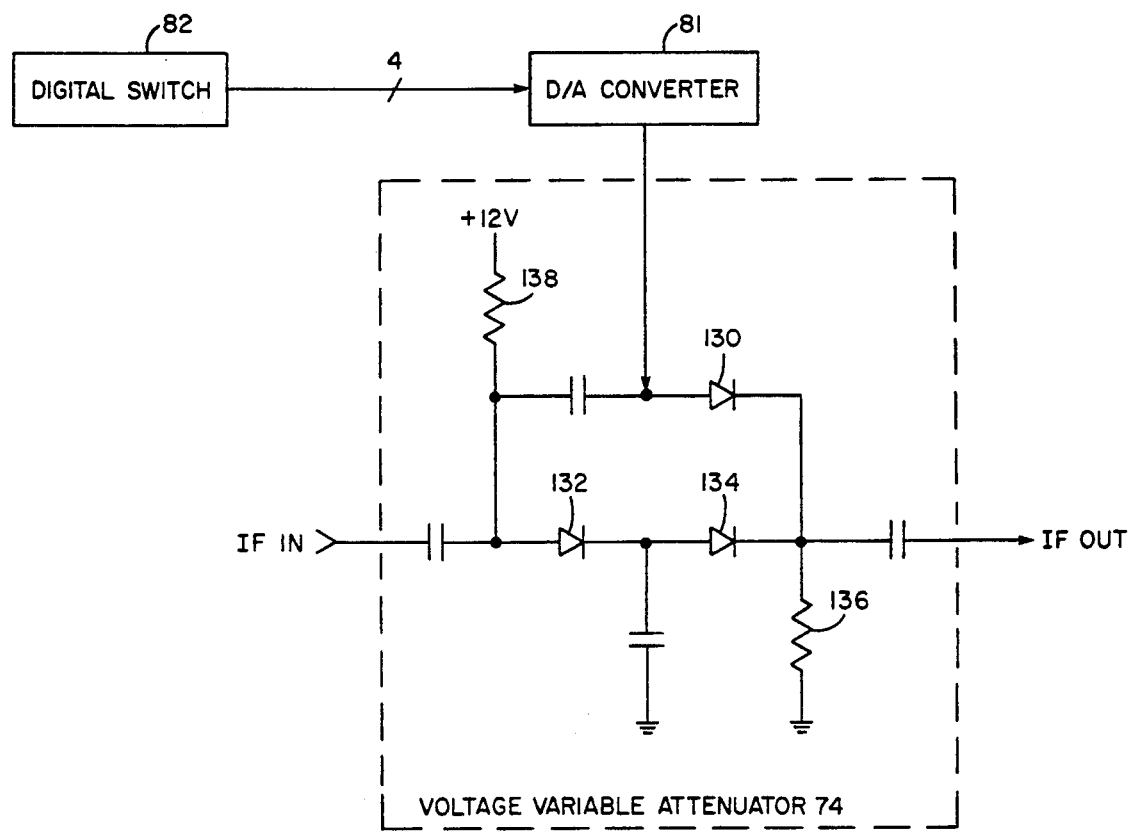
FIG. 8 is a schematic diagram of the voltage variable attenuator shown in FIG. 2.

The voltage variable attenuator 74 controls the amount of power output from the RPM 18 and as shown in FIG. 8 comprises a constant impedance current controlled attenuator comprising three pin diodes 130, 132 and 134. The voltage variable attenuator 74 is adjusted by a four bit digital switch 82 which produces a voltage output from the D/A converter 81. The variable current (0.075 ma to 6 ma) through pin diode 130 and resistor 136 gives approximately 0 to 15 dB of attenuation to the IF signal.

Figure 4:
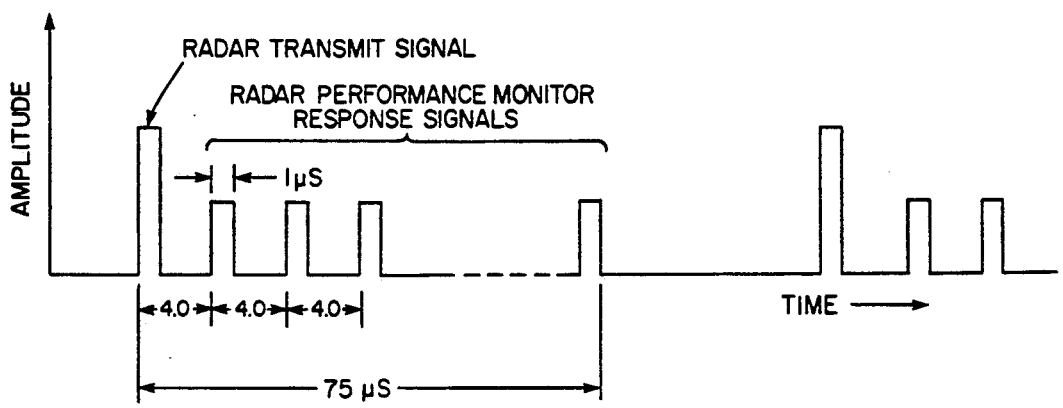
FIG. 4 is a timing diagram of the radar performance monitor response signals.
Figure 5:
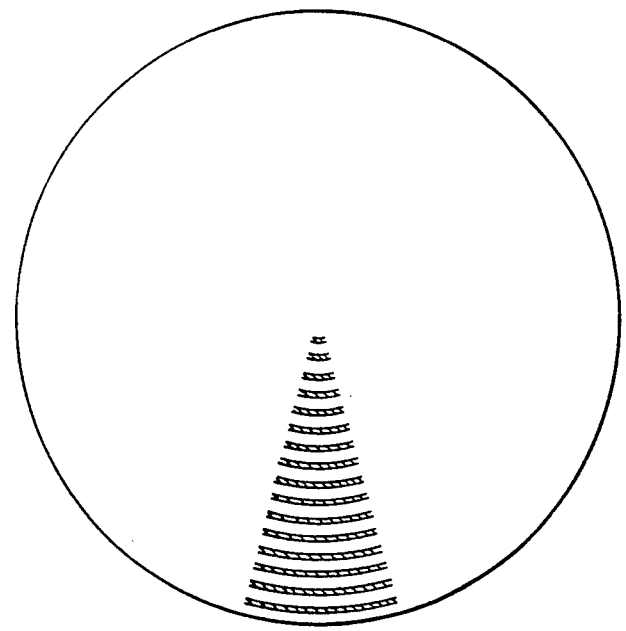
FIG. 5 shows a response pattern of a radar performance monitor on a radar system display.

Referring now to FIGS. 2, 4, and 5 the IF signal after passing through the voltage variable attenuator 74 is coupled to a power divider 76 which provides a portion of the output from the recirculating loop 80 to power splitter 50; the IF signal is upconverted to the original radar signal frequency by mixing the 180 MHz IF with the X-Band local oscillator signal in the frequency converter 22 for transmission via the antennas 20 and 12 to a radar receiver (MTR 14) in radar system 10 where it appears as a target on a display 10 at multiples of ¼ of a mile. The recirculating loop 80 of RPM 18 continues to generate response signals or targets as shown in FIG. 4 until a one-shot in the multiplexer control 60 turns off the feedback input (R-port) of multiplexer 54. The transmitter input (T-port) is enabled 265 microseconds later and the response signal generating cycle repeats upon receipt of a next transmit pulse. FIG. 5 shows a display screen of radar display 16 which is displaying a wedge-shaped pattern generated by the response signals from the RPM 18. The loop lock detector 62 receiving an input from the multiplexer control 60 and having an output coupled to a light emitting diode (LED) indicator 64 provides a means of indicating that the RPM 18 is operating properly without the need for sophisticated test equipment. The timing is implemented such that the loop 80 has to be circulating for a full 75 microseconds before the LED indicator 64 is turned on.

Still referring to FIG. 2, a transmitter calibrate switch 52 is shown coupled between the power splitter 50 and multiplexer 54. The transmitter calibrate switch 52 provides for calibration of the radar system 10 transmitter in the MTR 14 by manually switching a 5 dB pad into the IF input line 86. With the 5 dB pad inserted, detector 58 is adjusted so that the RPM 18 is marginally operational, and then the 5 dB pad is switched out. When the 5 dB pad is switched out and if the transmitter power of radar system 10 drops by more than 5 dB during normal operation, the RPM 18 will cease to operate which is immediately detected by an operator at the display 16 of radar system 10.

A receiver calibrate switch 78 is shown coupled between the power divider 76 and power splitter 50 in line 88. The receiver calibrate switch 78 provides for calibration of the receiver in the MTR 14 of radar system 10 by remotely switching a 10 dB pad into the output line 88 from power divider 76 at the recirculating loop 80 output in RPM 18. When the 10 dB pad is switched in, the output signal from the RPM 18 is reduced by 10 dB. The voltage variable attenuator 74 is adjusted by means of digital switch 82 located at the display 16 to make the output signals of the RPM 18 on the display 16 of radar system 10 just barely visible. When the receiver calibrate switch 78 is returned to the operate position, the output level of the RPM 18 increases by 10 dB. The radar system 10 is now calibrated whereby a drop of 10 dB in receiver sensitivity in the radar MTR 14 causes the RPM 18 output signal being displayed on display 16 to disappear indicating a failure condition. A partial failure is indicated by the narrowing of the RPM 18 output signal arcs on display 16.

Referring now to FIG. 3A, there is shown a block diagram of the X-Band frequency converter 22 comprising an X-Band local oscillator 24 which is tunable from 9450 to 9650 MHz and has an output power level of +11 dBm. The total frequency variation over a temperature range of 0° C. to 100° C. is +12.5 MHz. Since the total range of frequency variation of the radar transmitter is +25 MHz (including magnetron manufacturer's tolerances, change of frequency during warm-up, and steady-state variation with ambient temperature) and since the bandwidth of the recirculating loop and other IF components (determined by the bandwidth of the delay line) is 80 MHz, the stability of the local oscillator frequency with changes in ambient temperature is adequate and no heater or other means of limiting the range of temperature for the local oscillator is required. The output of the X-Band local oscillator 24 is coupled to amplifier 26 which provides 2 dB of gain. Amplifier 26, readily known to one skilled in the art, comprises two identical stages (not shown) each consisting of a chip attenuator followed by an FET amplifier. Variations in gain are achieved by the chip attenuators. The amplifier 26 is used as a buffer to prevent pulling of the X-Band oscillator 24. The amplifier 26 output is coupled to a 3 dB hybrid coupler 28 which receives at another input the X-Band RF 9410 MHz signal from antenna 20 and provides isolation between the RF signal and the local oscillator signal while combining them at the expense of 3 dB loss. The outputs of the 3 dB hybrid coupler 28 are coupled to a mixer diode 30 and the resulting IF signal is coupled to a low pass filter 32 which reflects the RF signal and the oscillator signal back to the diode. The low pass filter has a 6000 MHz cutoff and provides greater than 30 dB rejection of the RF and local oscillator X-Band signals. The IF signal generated at the input of the low pass filter 32 is nominally 180 MHz.

Referring now to FIG. 3B, an alternate RF section or frequency converter 34 is shown having an S-Band oscillator 36 producing a 3230 MHz signal at an output power level of approximately +9 dBm. The frequency variation from 0° C. to 100° C. is 3 MHz which is better stability than at X-Band and hence quite adequate. The 3230 MHz signal is coupled to an amplifier 38 which isolates the local oscillator 36 from impedance changes and increases the 3230 MHz oscillator signal level to +18 dBm. The amplifier 38 output is coupled to a 3 dB hybrid coupler 40 which receives at another input the S-Band RF 3050 MHz signal from antenna 20 and provides isolation between the RF signal and the local oscillator while combining them at the expense of 3 dB loss. The outputs of the 3 dB hybrid coupler 40 are coupled to a single diode mixer 42 and a low pass filter 44. The diode mixer 42 mixes the RF signal and local oscillator signal and produces an IF output signal at a nominal 180 MHz. The low pass filter 44 has a 2300 MHz cutoff to provide rejection of the RF and oscillator signals and to pass the 180 MHz IF signal.

This concludes the description of the preferred embodiment. However, many modifications and alterations will be obvious to one of ordinary skill in the art without departing from the spirit and scope of the inventive concept. Therefore, it is intended that the scope of this invention be limited only by the appended claims.

What is claimed is:

1. A radar performance monitor mounted near an antenna of a radar system comprising:
   means for receiving a radar signal from said radar system antenna, said monitor operating asynchronous with said radar system;
   means coupled to said receiving means for converting said radar signal to an intermediate frequency (IF) signal;
   means coupled to said converting means for gating said IF signal to a recirculating loop when said IF signal exceeds a predetermined amplitude;
   said recirculating loop comprising a SAW delay line means for generating a plurality of simulated radar target return signals of equal amplitude by using a frequency of said received radar signal providing said frequency falls within a predetermined bandwidth of said SAW delay line means, said recirculating loop having a gain greater than unity for maintaining said generated signals of equal amplitude; and
   means coupled to said recirculating loop for transmitting said plurality of simulated radar target return signals to said radar system antenna for displaying said simulated radar target return signals on a display means of said radar system.

2. The radar performance monitor as recited in claim 1 wherein:
   said radar performance monitor comprises means coupled between said converting means and said gating means for calibrating a power level of a transmitter output of said radar system.

3. The radar performance monitor as recited in claim 1 wherein:
   a power divider means provides for coupling said plurality of simulated radar target return signals from said recirculating loop to said transmitting means.

4. The radar performance monitor as recited in claim 1 wherein:
   said plurality of simulated radar target return signals provide a distinctive test pattern on said display means of said radar system comprising a series of arcs having a predetermined width and separation in range and extending from a first to a second predetermined range limit on said display means, the azimuth width of said pattern being determined by a radiation pattern of said radar antenna.

5. The radar performance monitor as recited in claim 1 wherein:
   said simulated radar target returns are displayed on said display means of said radar system simultaneously with normal radar target returns and are readily distinguishable from said normal radar target returns.

6. A radar performance monitor mounted near an antenna of a radar system comprising:
   means for receiving a radar signal from said radar system antenna, said monitor operating asynchronous with said radar system;
   means coupled to said receiving means for converting said radar signal to an intermediate frequency (IF) signal;
   power splitting means coupled to said converting means for coupling said IF signal to and from a recirculating loop;
   means coupled to said power splitting means for gating and detecting said IF signal above a predetermined threshold;
   means coupled to said gating and detecting means for controlling the number of simulated radar target return signals generated by said recirculating loop;

means coupled to said gating and detecting means for providing equal amplitudes for said simulated radar target return signals;

SAW delay line means, coupled to said equal amplitude return signals providing means, for generating a plurality of said simulated radar target return signals by using a frequency of said received radar signal providing said frequency falls within a predetermined bandwidth of said SAW delay line means, said recirculating loop having a gain greater than unity for maintaining said generated signals of equal amplitude;

variable attenuator means coupled to said generating means for adjusting the power output of said generated return signals;

power divider means coupled to said variable attenuator means for providing a first output for said plurality of simulated radar target return signals from said recirculating loop and for coupling a second output to an input of said gating and detecting means thereby forming said recirculating loop; and means coupled to said power splitter means for transmitting said plurality of simulated radar target return signals of equal amplitude to said radar system antenna for displaying said target return signals on a display means of said radar system.

7. The radar performance monitor as recited in claim 6 wherein:
generating means comprises an amplifier means for providing predetermined signal levels to said variable attenuator means.

8. The radar performance monitor as recited in claim 6 wherein:
said variable attenuator means comprises means for a radar operator to remotely adjust said variable attenuator means.

9. The radar performance monitor as recited in claim 6 wherein:
a switchable attenuating means coupled between said power splitting means and said controlling means provides for calibrating a transmitter of said radar system.

10. The radar performance monitor as recited in claim 6 wherein:
a switchable attenuating means coupled between said power divider means and said power splitter means provides for calibrating a receiver of said radar system.

11. The radar performance monitor as recited in claim 6 wherein:
said controlling means coupled to said gating and detecting means comprises timing means for turning on said recirculating loop while inhibiting a subsequent IF signal from entering said loop for a first predetermined time period, and turning off said recirculating loop for a second predetermined time period before allowing said subsequent IF signal to enter said recirculating loop.

12. A method of determining the performance of a radar system by mounting a radar performance monitor near an antenna of said radar system comprising the steps of:
receiving a radar signal transmitted by said antenna, said monitor operating asynchronous with said radar system;
converting said radar signal to an intermediate frequency (IF) signal;
gating said IF signal to a recirculating loop when said IF signal exceeds a predetermined amplitude;
generating a plurality of simulated radar target return signals of equal amplitude by using a frequency of said received radar signal providing said frequency falls within a predetermined bandwidth of a surface acoustical wave delay line mans in said recirculating loop;
providing said recirculating loop with a gain greater than unity for maintaining and generated signals of equal amplitude; and
transmitting said plurality of simulated radar target return signals to said antenna of said radar system for observation on a display of said radar system.

13. The method as recited in claim 12 wherein:
said step of generating said plurality of simulated radar target return signals comprises coupling said signals by a power divider means from said recirculating loop to said transmitting means.

14. The method as recited in claim 12 wherein:
said method further comprises the step of providing on said display a distinctive pattern of said plurality of simulated radar return signals in the form of a series of arcs separated in range and extending from a first to a second predetermined range limit on said display means, the azimuth width of said pattern being determined by a radiation pattern of said radar antenna.

* * * * *